United States Patent
Chen

(10) Patent No.: US 9,736,954 B2
(45) Date of Patent: Aug. 15, 2017

(54) RETAINING DEVICE FOR POWER DISTRIBUTION UNIT

(71) Applicant: EATON MANUFACTURING LP, GLASGOW, SUCCURSALE DE MORGES, Morges (CH)

(72) Inventor: George Chen, Shenzhen (CN)

(73) Assignee: Eaton Manufacturing LP, Glasgow, Succursale De Morges (CH)

( * ) Notice: Subject to any disclaimer, the term of this patent is extended or adjusted under 35 U.S.C. 154(b) by 0 days.

(21) Appl. No.: 14/894,032

(22) PCT Filed: Apr. 28, 2014

(86) PCT No.: PCT/CN2014/076311
§ 371 (c)(1),
(2) Date: Nov. 25, 2015

(87) PCT Pub. No.: WO2014/190833
PCT Pub. Date: Dec. 4, 2014

(65) Prior Publication Data
US 2016/0120049 A1    Apr. 28, 2016

(30) Foreign Application Priority Data
May 30, 2013    (CN) .......................... 2013 1 0209713

(51) Int. Cl.
*H05K 5/02*    (2006.01)
*H01R 13/73*    (2006.01)
(Continued)

(52) U.S. Cl.
CPC .......... *H05K 5/0221* (2013.01); *F16M 13/02* (2013.01); *H01R 13/73* (2013.01); *H05K 5/0204* (2013.01);
(Continued)

(58) Field of Classification Search
USPC ........................................................ 174/135
See application file for complete search history.

(56) References Cited

U.S. PATENT DOCUMENTS 5,228,870 A * 7/1993 Gorenc ............. H01R 12/7064
439/567
6,450,462 B1 * 9/2002 Hsieh ..................... F16M 13/02
248/125.1
(Continued)

FOREIGN PATENT DOCUMENTS

CN    2850079    12/2006
DE    103 59 489 A1    9/2004
(Continued)

OTHER PUBLICATIONS

International Search Report Corresponding to International Application No. PCT/CN2014/076311; dated Aug. 5, 2014; 4 Pages.

*Primary Examiner* — Dhirubhai R Patel
(74) *Attorney, Agent, or Firm* — Ward and Smith, P.A.

(57) ABSTRACT

Abstract in the disclosure a retaining device (1) for stopping a relative movement between a rail member and a sliding rack (3) is provided, includes: a first member (11), having a first engagement portion; a second member (12), having a second engagement portion; and a handle member (13) pivotally mounted onto the first member (11) via a pivot (14). The second member (12) includes a stopping portion (121), and the handle member (13) includes a first contacting edge (131) and a second contacting edge (132) which are configured to selectively abut against the stopping portion by means of the pivotal movement of the handle member (13). A distance between the second contacting edge (132) and the pivot (14) is greater than a distance between the first contacting edge (131) and the pivot (14), such that a distance between the first and the second engagement portions when the second contacting edge (132) contacts the stopping
(Continued)

portion (121) is greater than a distance between the first and the second engagement portions when the first contacting edge (131) contacts the stopping portion (121).

11 Claims, 13 Drawing Sheets

(51) Int. Cl.
*F16M 13/02* (2006.01)
*H05K 7/14* (2006.01)
*H01R 24/78* (2011.01)
*H01R 25/00* (2006.01)

(52) U.S. Cl.
CPC ......... *H05K 7/1457* (2013.01); *H05K 7/1492* (2013.01); *H01R 24/78* (2013.01); *H01R 25/006* (2013.01)

(56) References Cited

U.S. PATENT DOCUMENTS

| | | | |
|---|---|---|---|
| 8,756,772 B2 * | 6/2014 | Padmore | H02G 3/0418 |
| | | | 174/101 |
| 2002/0022406 A1 | 2/2002 | Hutchison | |
| 2010/0127141 A1 | 5/2010 | Chan et al. | |
| 2013/0082019 A1 | 4/2013 | Fan | |

FOREIGN PATENT DOCUMENTS

| | | |
|---|---|---|
| EP | 1 835 794 A2 | 3/2007 |
| JP | 3227147 | 11/2001 |

\* cited by examiner

RETAINING DEVICE FOR POWER DISTRIBUTION UNIT

RELATED APPLICATIONS

The present application is a 35 U.S.C. §371 national phase application of PCT International Application No. PCT/CN2014/076311, having an international filing date of Apr. 28, 2014, claiming priority to Chinese Patent Application No. 201310209713.4, filed May 30, 2013. The disclosures of each application are incorporated herein by reference in their entireties. The above PCT International Application was published in the Chinese language as International Publication No. WO 2014/190833.

TECHNICAL FIELD

The present invention relates to the field of power distribution unit (PDU), especially to a retaining device for the PDU of rail-sliding rack type and to a PDU assembly having the same.

BACKGROUND

Nowadays the information center typically includes many frames in each of which a plurality of servers or uninterrupted power systems (UPS) are horizontally stacked from up to down. In order to distribute power to each server and UPS within the frame, power distribution units (PDUs) which are generally configured to provide multiple sockets similar to those in the household plug board are assembled into the frame vertically or horizontally. Since there is no standard for the vertical distances between the mounting apertures in the frame, various installation systems for the PDU of rail-sliding rack type are provided in the prior art.

US application publication No. US20020022406A1 discloses a conventional installation system for the PDU of rail-sliding rack type, comprising a rail structure or a rail member arranged on the back surface or bottom cover of the PDU, and a sliding rack cooperated with the rail structure, wherein the sliding rack can be assembled into a frame and the rail structure may press fit into the sliding rack, so as to realize the installation of the PDU. In the above-mentioned installation system, the PDU is retained in relation to the frame mainly by means of the contacting friction between the rail structure and the sliding rack. Such installation system has a drawback that the PDU may slide down or even fall down relative to the sliding rack and thus the frame, when the PDU product is relatively heavy or encounters a greater external force in vertical direction.

The co-pending Chinese patent application No. CN201110459201.4 assigned to the assignee of the present application provides a retaining element for stopping the relative movement between the rail member and the sliding rack. The rail member at its bottom has a longitudinally extending groove. The retaining element comprises a body extending transversely along the sliding rack and having a side surface for abutting against the sliding rack and two ends opposed to each other in the transverse direction, with one of the ends having a catch portion which press fits with a first side surface and a second side surface of the groove, and the other end of the body opposed to the catch portion as a free end. The catch portion is provided with a protrusion, as a balance pivot, for pressing the latch portion into or removing it from the groove by means of the free end. In the event that the PDU slides due to an accident such as earthquake, the PDU may be effectively stopped so as not to further slide down or fall down by means of the tool-free retaining element.

In the CN patent application, a groove formed on the bottom surface (i.e. the backside facing the rail rack or frame) of the housing of the PDU (or rail member) is required for the retaining element for PDU, which restricts the range of applications. For example, the retaining element is not suitable for the PDU without a groove formed on the backside of the housing, e.g., the power distribution system disclosed in the GB patent GB2292489B assigned to the applicant of this application. Moreover, providing a groove at the bottom surface of the housing will adversely increase the thickness of the PDU increases, which contradicts with the current tendency of providing a PDU as compact as possible.

SUMMARY OF THE INVENTION

Therefore, it is the object of the present invention to address the problems existing in the prior art to provide a retaining device for power distribution unit which is widely used in various applications. In another aspect of the invention, a power distribution unit assembly is provided.

In an aspect of the invention, a retaining device for stopping the relative movement between a rail member and a sliding rack is provided, comprising: a first member having a first engagement portion for releasably engaging a first side of the rail member; a second member having a second engagement portion for releasably engaging a second, opposed side of the rail member; and a handle member pivotally mounted onto the first member via a pivot. The second member comprises a stopping portion, and the handle member comprises a first contacting edge and a second contacting edge which are configured to selectively abut against the stopping portion by means of the pivotal movement of the handle member. A distance between the second contacting edge and the pivot is greater than a distance between the first contacting edge and the pivot, such that a distance between the first and second engagement portions when the second contacting edge contacts the stopping portion is smaller than a distance between the first and second engagement portions when the first contacting edge contacts the stopping portion, so as to releasably clamp the retaining device to the rail member.

The retaining device of the invention enable the change of the (transverse) distance between the first and the second engagement portions by means of the different distances of the first and the second contacting edges, such that the retaining device can be releasably clamped to the rail member. Therefore the retaining device can be widely used in various PDU housings (rail members) without the provision of a groove in the bottom face, so as to provide a compact structure. Moreover installation of the retaining device is tool free. Besides, the retaining device of the invention can on one hand be secured to the rail member by means of lever mechanism, and on the other hand the handle member will not extend beyond the sides of the PDU when the retaining device is secured, avoiding from adversely affecting the assembly of the adjacent PDUs at two sides. For example, this can be achieved by substantially aligning the longitudinally extending direction of the handle member with the longitudinally extending direction of the rail member (or the housing of PDU) when the retaining device is secured.

Preferably, the first engagement portion comprises a first hook portion extending towards the longitudinal axis of the rail member; and the second engagement portion comprises a second hook portion, opposed to the first hook portion, extending towards the longitudinal axis of the rail member, such that an improved clamping effects is achieved.

In a preferred embodiment, the rail member includes a first groove and a second groove longitudinally extending along the first side and the second side, respectively, and the first hook portion and the second hook portion are configured to press fit into the bottoms of the first groove and the second groove, respectively, when the second contacting edge abuts against the stopping portion. This configuration is particularly preferred because the grooves arranged at either side of the rail member can advantageously prevent the retaining device from moving horizontally away from the rail device (the PDU housing) in a direction perpendicular to the back side surface of the rail device. Conveniently, it is not necessary to provide further grooves customized for the retaining device, but the sliding rack that press fits into the rail member may share grooves with the retaining device. However it should be appreciated by the person skilled in the art that providing the further grooves customized for retaining device is also possible.

In a further preferred embodiment, the rail member comprises a first indentation and a second indentation at the first side and the second side, respectively, the first indentation and the second indentation each having a limiting edge portion for preventing the movement of the retaining device relative to the rail member. The first hook portion and the second hook portion are configured to be positioned into the first indentation and the second indentation, respectively, when the second contacting edge abuts against the stopping portion, and to be releasable from the first indentation and the second indentation when the first contacting edge abuts against the stopping portion.

It should be appreciated by the person skilled in the art that the first and second indentations may be as an alternative or in addition to the first and second grooves, although the first and second indentations would include limiting edge portions so as to stop the retaining device at least when the rail member is moving relatively to the sliding rack and contacting with or impacting on the retaining device.

In a preferred embodiment, the first member defines a wider portion and a narrower portion, and the second member has a cut-out which opens laterally, the narrower portion being slidably received in the cut-out. This ensures the relative positioning of the first and second members along the longitudinal direction of the rail member.

In a further preferred embodiment, the handle member is in form of a plate-like elongated member, the first contacting edge being defined by a longitudinal end face of the handle member and the second contacting edge being defined by a narrow side face of the handle member, and provided between the first contacting edge and the second contacting edge is a curved transition section, which facilitate a smooth pivot of the handle member so as to prolong the service life of the retaining device.

In a further preferred embodiment, the retaining device further comprises a buffering member for providing buffering action during the relative movement between the rail member and the sliding rack such that when the rail member slides vertically relative to the sliding rack due to an accident, the sliding rack will initially encounter with the buffering member so as to buff and thus stop the movement of the rail member.

In a further preferred embodiment, the buffering member is in form of a sheet shape, and attached to the first member at a side of the first member facing away from the handle member. This provides a relatively greater buffering contact area.

In a further preferred embodiment, each of the first member, the second member and the handle member is in the form of an integral sheet metal part, so as to provide simple manufacture and relatively thin structure.

In another aspect of the invention, a power distribution unit assembly is provided, comprising: a power distribution unit housing pressingly mounted onto the stationary sliding rack, the housing comprising a first groove and a second groove longitudinally extending along a first side and a second side of the housing, respectively; and a retaining device for stopping the relative movement between the housing and the sliding rack. The retaining device includes: a first member having a first hook portion for releasably engaging the first groove; a second member having a second hook portion for releasably engaging the second groove; and a handle member pivotally mounted onto the first member via a pivot. The second member comprises a stopping portion, and the handle member comprises a first contacting edge and a second contacting edge which are configured to selectively abut against the stopping portion by means of the pivotal movement of the handle member. A distance between the second contacting edge and the pivot is greater than a distance between the first contacting edge and the pivot, such that the first hook portion is at a first distance from the second hook portion when the first contacting edge abuts against the stopping portion, such that the first hook portion and the second hook portion are loosely mounted into the first groove and the second groove in such way that they are undetachable from the housing, and that the first hook portion is at a second distance, which is smaller than the first distance, from the second hook portion when the second contacting edge abuts against the stopping portion, such that the first hook portion and the second hook portion engage to the bottoms of the first groove and the second groove.

The PUD assembly may be provided as a kit, such that the retaining device of the invention may be mounted onto the housing loosely but undetachably, and is able to be easily secured onto the housing when necessary, such as to enable stopping the relative movement between the PDU and the sliding rack in an easy, especially tool-free manner.

In a preferred embodiment, the first hook portion and the second hook portion are configured to press fit into the bottoms of the first groove and the second groove, respectively, when the second contacting edge abuts against the stopping portion.

In another preferred embodiment of the invention, the first groove and the second groove at the bottoms define a first indentation and a second indentation, respectively, the first indentation and the second indentation each having a limiting edge portion for preventing the movement of the retaining device relative to the housing, the first hook portion and the second hook portion being configured to be positioned into the first indentation and the second indentation, respectively, when the second contacting edge abuts against the stopping portion. This is advantageous because it will prevent the PDU housing to be deformed.

Other features and advantages of the invention will partially become apparent to the persons skilled in the art after reading the disclosure, and will partially be described in the embodiments below with reference to the accompanying drawings.

BRIEF DESCRIPTION OF THE DRAWINGS

The embodiments of the invention will be described in detail below with reference to accompanying drawing:

FIG. 7a-7c show schematic views of installation of the retaining device according to another embodiment of the invention, in which FIG. 7a shows the indentation in the groove in a perspective view, FIG. 7b is a partially detailed view of FIG. 7a, and FIG. 7c is a partial view of the indentation in the groove from the backside, with each Figure being partially cut to show the indentation.

The same or similar reference numerals represent same or similar features in the drawings.

LIST OF REFERENCE NUMERALS

Figure 1A:
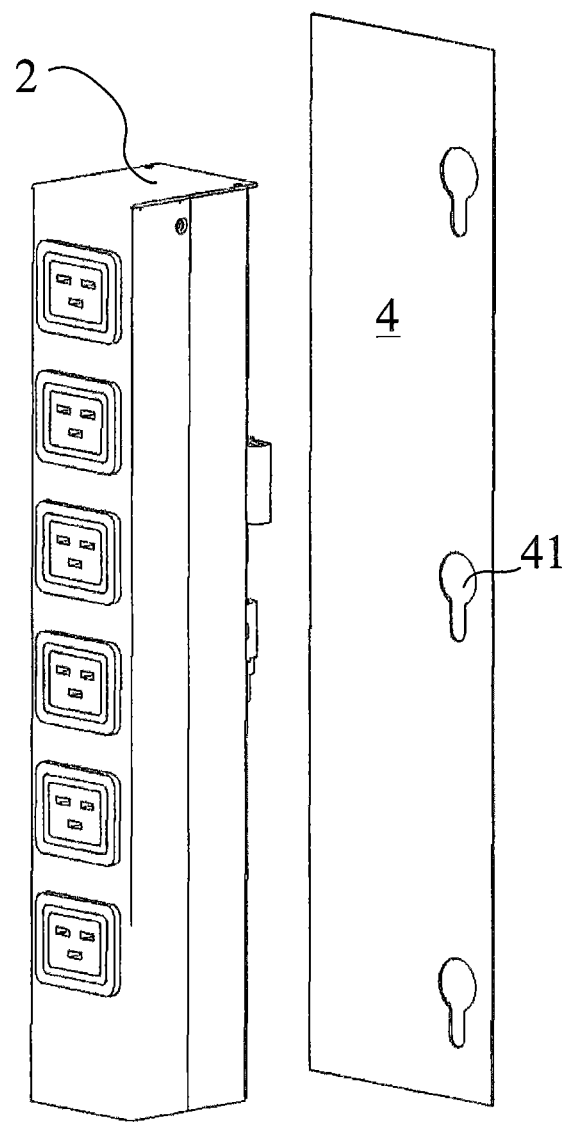
FIG. 1a-1e are schematic views of the PDU mounted on the frame by means of the sliding rack, wherein in the FIG. 1d and FIG. 1e the frame are partially cut-out to show the retaining device according to an embodiment of the invention.
Figure 1B:
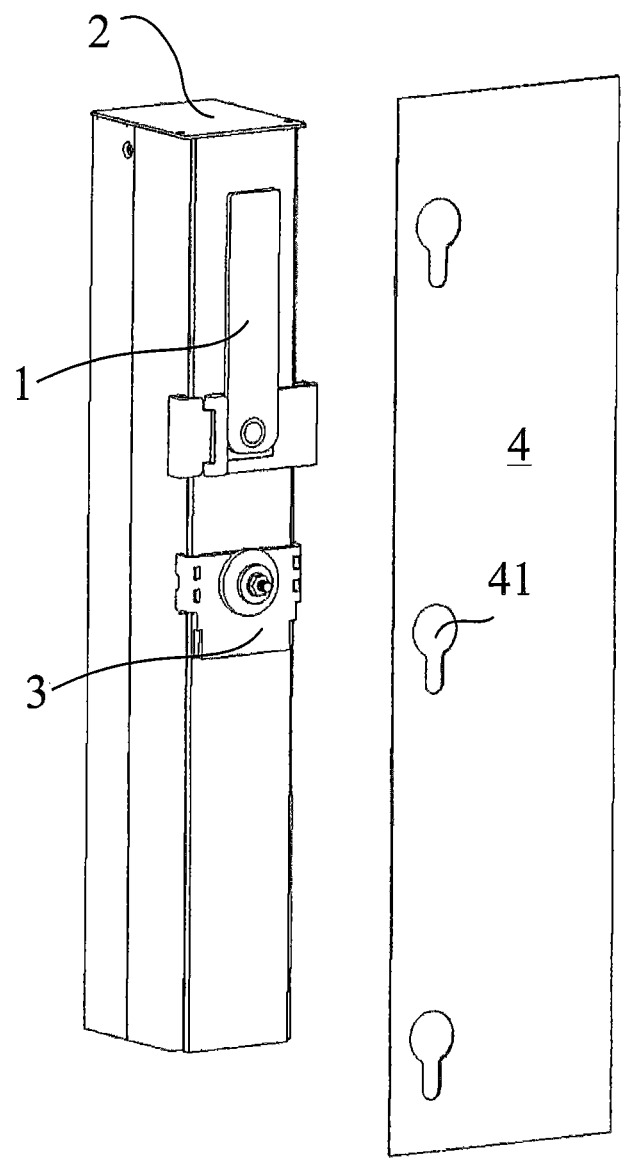
Figure 1C:
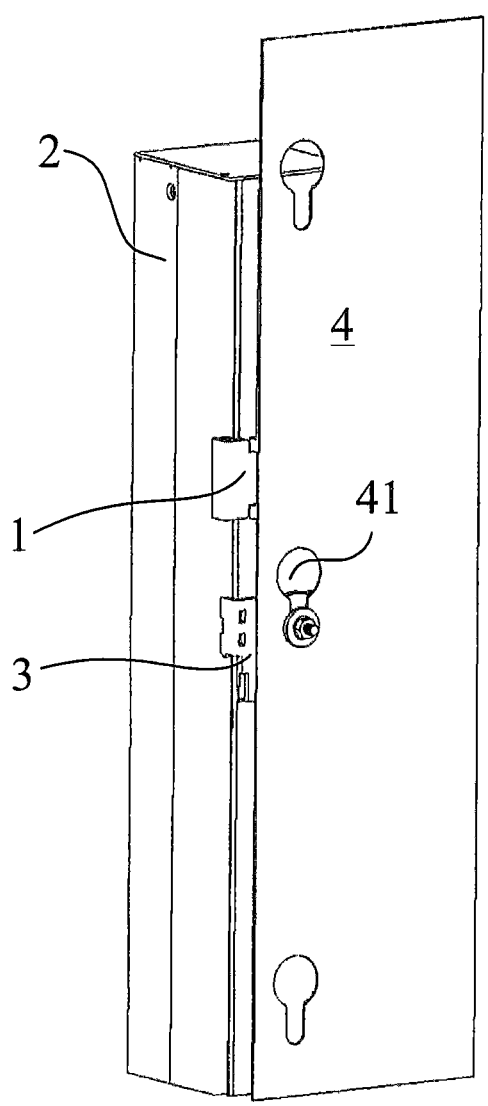
Figure 1D:
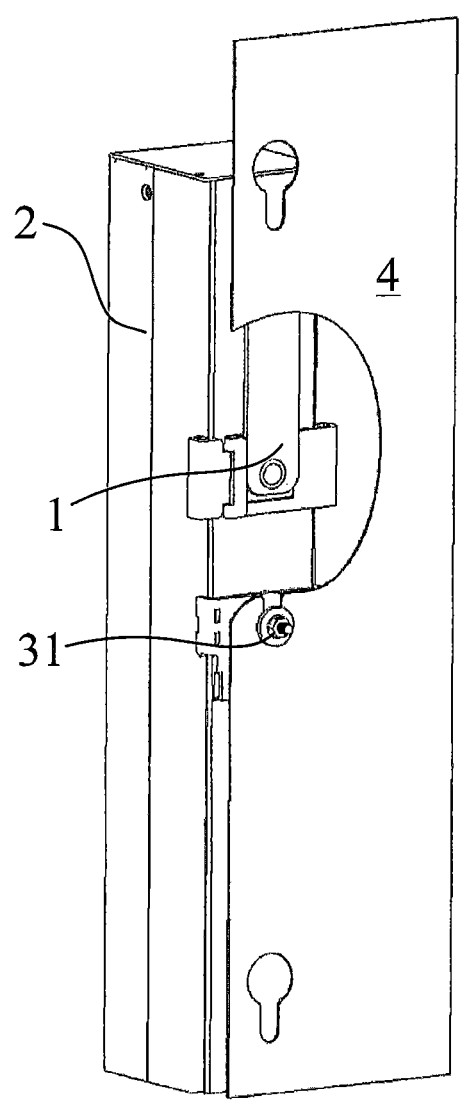
Figure 1E:
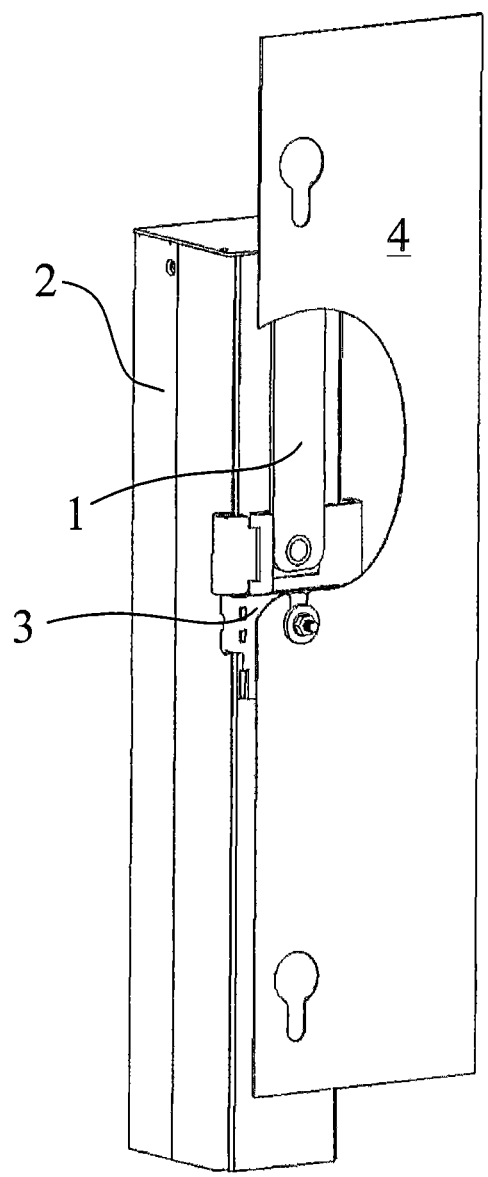

1—retaining device; 11—first member; 111—wider portion; 112—narrower portion; 113—bending portion; 114—first hook portion; 115—pivot hole; 12—second member; 121—stopping portion; 122—cut-out 123—bending portion; 124—second hook portion; 13—handle member; 131—first contacting edge; 132—second contacting edge; 133—curved transition portion; 134—body; 135—pivot hole; 14—pivot; 15—buffering member; 2—power distribution unit (PDU) housing; 21—first groove; 22—second groove; 23—first indentation; 25—edge portion; 27—flange; 3—sliding rack; 31—thread fastening mechanism; 32—engaging hook; 4—frame; 41—hole; W1—first width; W2—second width; G1—first distance; G2—second distance.

DETAILED DESCRIPTION OF THE EMBODIMENTS

For a better understanding of the features, purposes and effects of the present invention, the embodiments of the invention will be described with reference to the accompanying drawings. Although the accompanying drawings are used for better illustrating some embodiments of the invention, the drawings are not necessarily depicted in an exact dimensions and shapes of the illustrated embodiments, with some features being exaggerated, removed, partially sectioned or schematically depicted for a better illustration of the disclosure. As used herein, the term "in the drawings" or the like needs not to refer to all the drawings or example.

In the context the directional terms, such as "upper", "lower", "left", "right", "upward", "downward" or the like, for describing the drawings are given with reference to the directions of the drawings, but not be limiting.

As used herein the terms "about" or "substantially" should be understood by the person skilled in the art and encompasses the approximate to the features they modify, especially the equivalents in the sense of engineering. For the numeric value or range, the term "about" is intended to vary to some extent depending upon the value or the range.

FIGS. 1a-1e are schematic views showing a power distribution unit (PDU), especially a power distribution unit (PDU) housing 2, which is mounted to a frame 4 via a sliding rack 3. Particularly referring to FIGS. 5 and 6, the sliding rack 3 comprises a substantially plate-like body preferably made of plastic, and engaging hooks 32 extending at either side of the body. Correspondingly, the PDU housing 2 comprises a first groove 21 and a second groove 22 extending longitudinally at both longitudinal side respectively, and the engaging hooks 32 for example press-fits into these two grooves 21, 22. Moreover, the sliding rack 3 further includes a thread fastening mechanism 31 fixed onto the backside of the body. The thread fastening mechanism includes for example a screw threaded into the body, a nut and a washer or the like tightened onto the screw. The thread fastening mechanism 31 is configured such that it can be hung to a key-like hole 41 of the frame 4, to hold the PDU (housing) on the frame 4.

Although an exemplary sliding rack is illustrated, the construction of the sliding rack itself as well as its connection with the PDU are not critical in the context, and thus it should be appreciated that other suitable sliding racks may be used, for example those described in US2002022406A1 or CN201110459201.4, the contents of which are incorporated herein by reference.

The FIGS. 1a-1e also schematically illustrate a retaining device 1 according to an embodiment of the invention, which can be releasably secured to the PDU housing 2, e.g., made of metal, such as aluminum, and more specifically to the first and second grooves 21, 22 at either longitudinal side of the housing, in a tool-free manner, as would be described in details below. As illustrated, the retaining device 1 is able to stop the relative movement of the PDU housing 2 when the PDU moves relative to the sliding rack, or for example falls down in the event of an accident, which is especially illustrated in cut-out portion of the frame in FIG. 1e.

As mentioned above, such retaining device 1 is especially intended to be conveniently secured to the housing 2 in a tool-free manner, further with a simple, compact structure.

Figure 2:
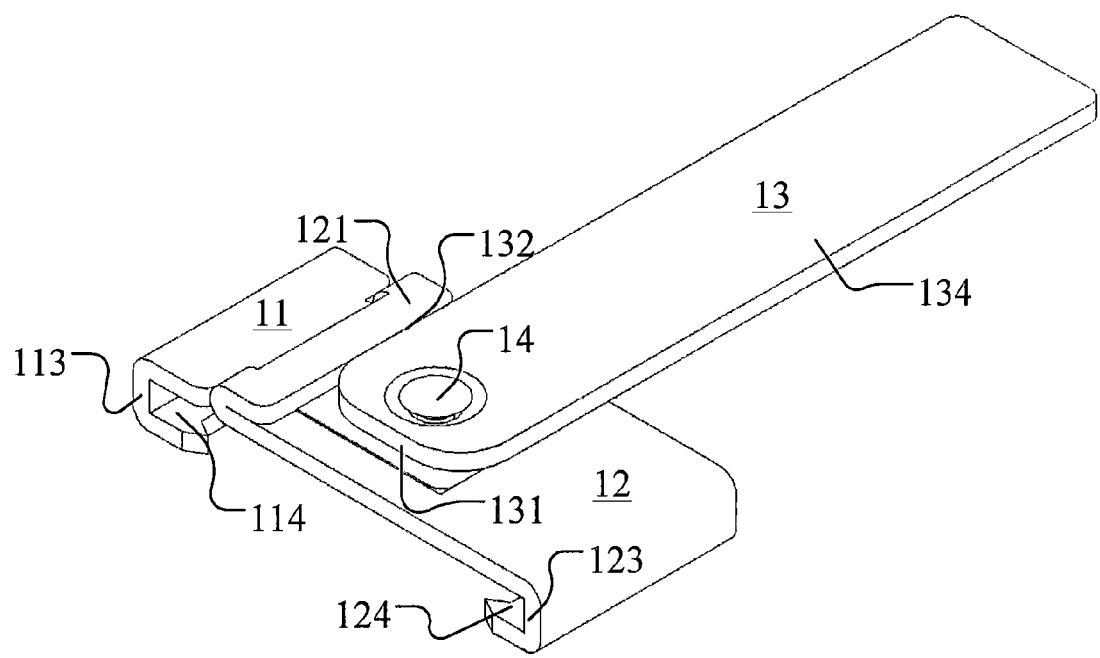
FIG. 2 shows a perspective view of the retaining device according to an embodiment of the invention.
Figure 3:
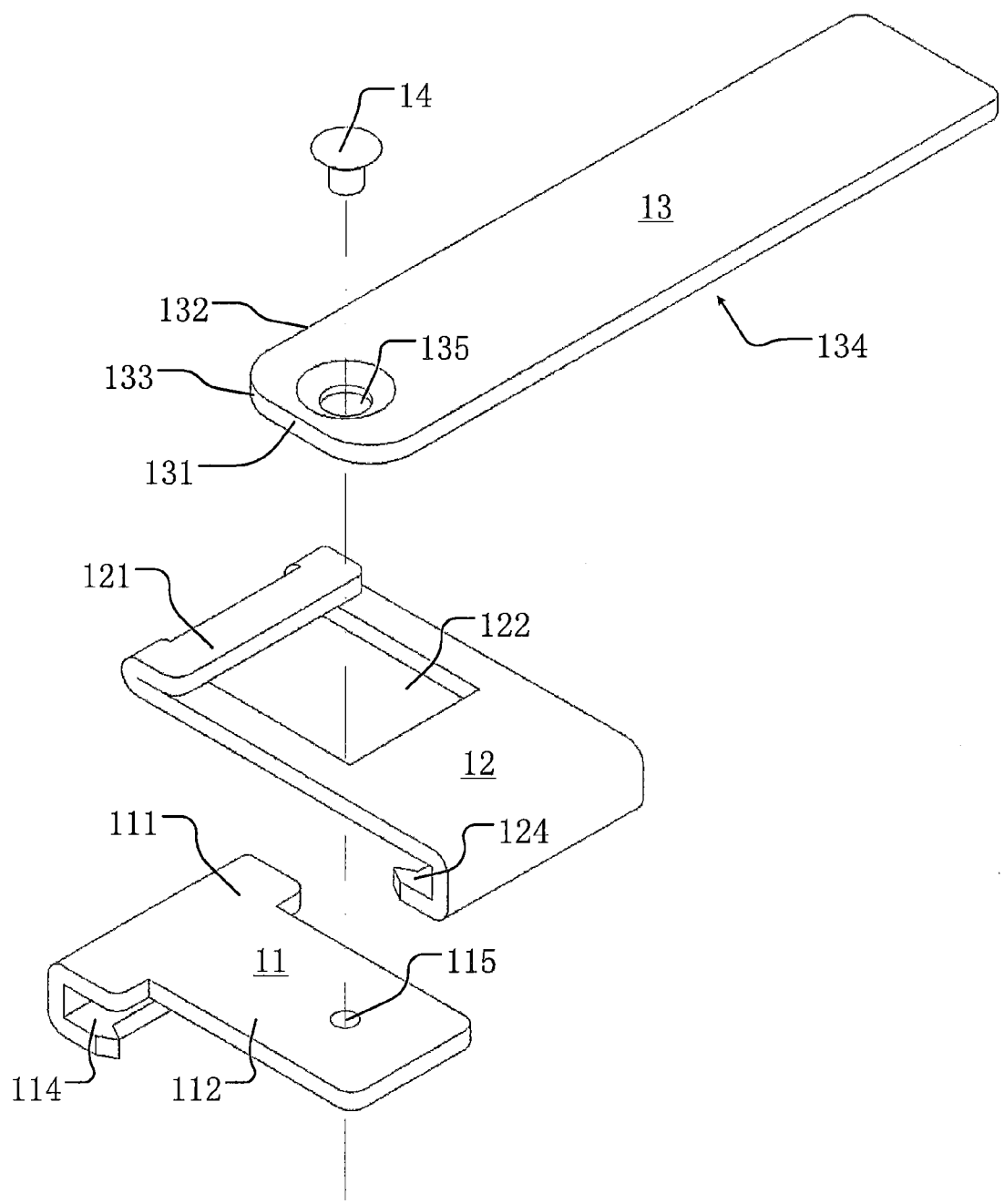
FIG. 3 shows an exploded view of the retaining device according to the embodiment of FIG. 2.

FIGS. 2-3 illustrate the retaining device according to an embodiment of the invention. The retaining device 1 may include a first member 11, a second member 12 and a handle member 13. As illustrated, the handle member 13 is pivotally mounted onto the first member 11 via a pivot 14. Accordingly, the first member 11 and the handle member 13 may each have a pivot hole 115, 135 for receiving the pivot 14. As illustrated, the pivot 14 is shaped to comprise a pin with a cap, however, it should be appreciated that the pivot may have other shapes, and may be formed as a separate member or integral with the handle member or the first member, for example a post extending from the members, as long as the handle member 13 is able to act pivotal movement relative to the first member.

In the illustrated embodiments, the first member 11, the second member 12 and handle member 13 each may be made of plate-shaped material, preferably made of sheet metal part, and more preferably made from stainless steel.

The first member 11 has a plate-like body substantially extending along the backside of the housing 2 and defining a wider portion 111 and narrower portion 112 such that the body is in form of a substantially T shape. The first member 11 has a bending portion 113, which extends substantially perpendicularly to the wider portion 111 from the body along a side of the housing 2 (shown in FIGS. 5 and 6). The first member 11 also has a first hook portion 114 extending from the bending portion 113, such that the first hook portion 114 is substantially perpendicular to the bending portion 113 and extends inwardly, and thus extends substantially parallel with the body of the first member. In the illustrated embodiment, the first hook portion 114 has two pointed tips (only one of which is shown), however it is conceivable of other number and structures of the hook structure.

The second member 12 also has a plate-like body extending along the backside of the housing 2, and the second member 12 defines a cut-out 122 which opens laterally, and a stopping portion 121 formed in the plate-like body. In the illustrated embodiment, for example, a rectangular cut-out (without a lateral opening) is punched out from a sheet metal part for forming the second member 12, then a lateral end is bent upwardly and inwardly to form the stopping portion 121 and the cut-out 122 with a lateral opening. However it is conceivable of other configurations of the stopping portion and the cut-out. The narrower portion 112 of the first member 11 may be correspondingly received into the cut-out 122, and the movement of the narrower portion 112 within the cut-out 122 can be limited by the wider portion 111 and/or an end of the cut-out.

Figure 5:
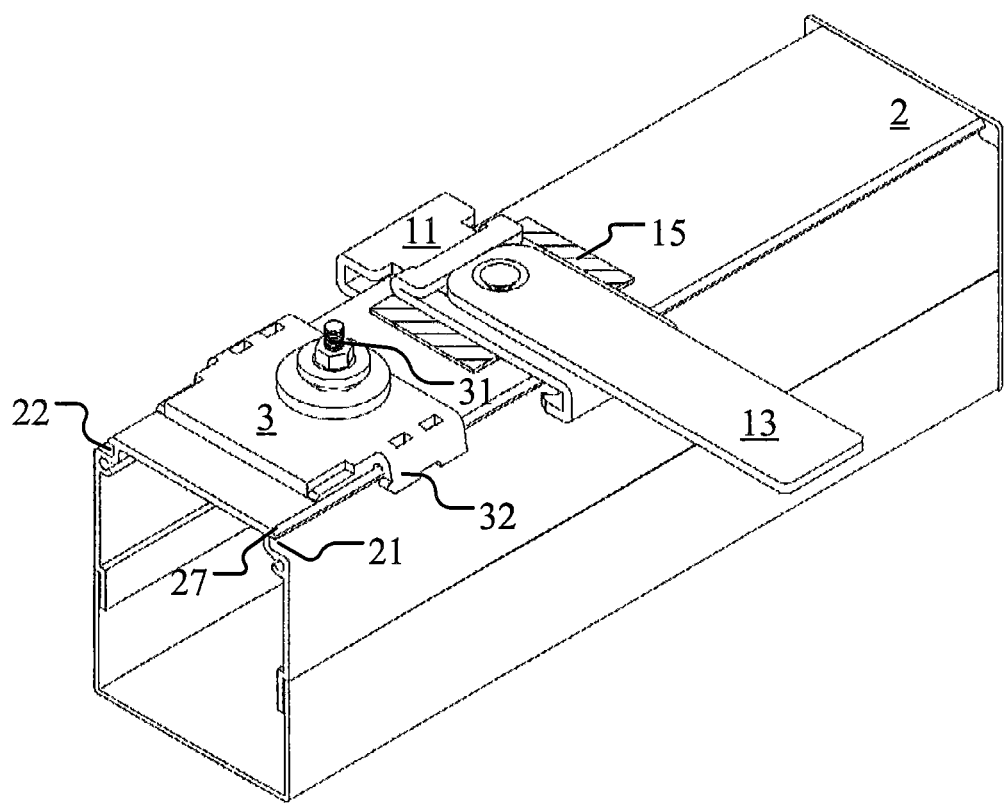
FIG. 5 shows the schematic view of the retaining device according to the embodiment of the invention, which is arranged, but not secured, to the PDU housing.
Figure 6:
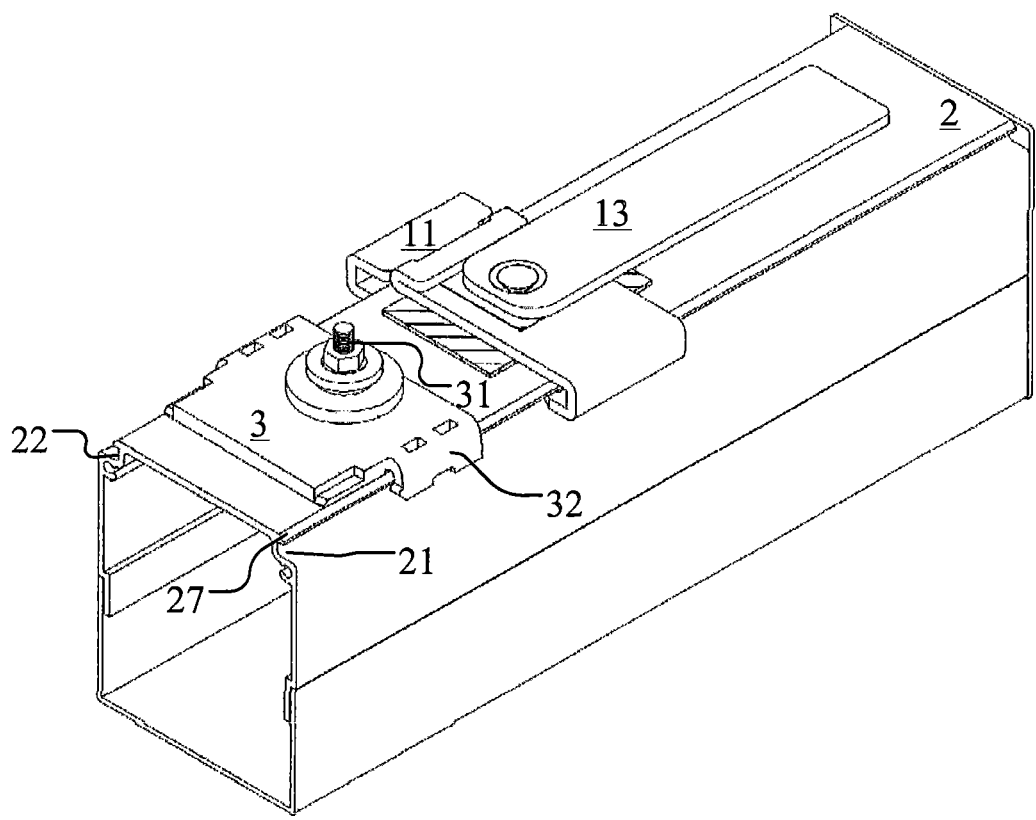
FIG. 6 shows the schematic view of the retaining device according to the embodiment of FIG. 5, which has been secured already.

Similarly, the second member 12 has a bending portion 123, which extends substantially, perpendicularly to the plate-like body of the second member 12 from the body along the other side of the housing 2 (shown in FIGS. 5 and 6). The second member 12 also has a second hook portion 124 extending from the bending portion 123, such that the second hook portion is substantially perpendicular to the bending portion 123 and extends inwardly, and thus extends substantially parallel with the body of the second member. In the illustrated embodiment, the second hook portion 124 has two pointed tips (only one of which is shown), however it is conceivable of other number and structures of the hook portion. By means of such arrangement, the first hook portion 114 of the first member 11 and the second hook portion 124 of the second member 12 extend inwardly (relative to the housing) and are opposed to each other, and thus are adapted to releasaby engage with the first groove 21 and the second groove 22 of the housing 2, respectively (as shown in FIGS. 5 and 6). Although in the illustrated embodiment the first and second hook portions preferably engage in the first and second grooves shared by the sliding rack 3, further grooves customized for the hook portions may be employed. Although the hook portions are illustrated to engage with the either side of the housing, it should be appreciated that other kinds of hook or engagement portions may be used to engage with either side of the housing and thus finally secure the retaining device to the housing.

Although the first member 11 and the second member 12 engage with either side of the housing 2 with the respective hook portions thereof, it is conceivable of other kinds of engagement, as long as it is able to secure the retaining device to the housing and stop the relative movement of sliding rack relative to the housing. In an embodiment that is not illustrated, the first and second engagement portions may be free of hook portions, but rather have plate-like clamping means for example, which, when the second contacting edge abuts against the stopping portion, clamp either side of the housing and secure the retaining device by means of e.g., pressing deformation and thus effectively stop the movement of the sliding housing relative to the housing. Other kinds of engagement portions which can effectively secure the retaining device when the second contacting edge abuts against the stopping portion are also possible.

Still referring to FIGS. 3, 5 and 6, the handle member 13 is in the form of an elongated plate, and pivotally connected to the first member 11 adjacent to a longitudinal end. Due to the pivotal connection as well as the stopping portion 121 and cut-out 122, the second member 12 is held by the first member 11 and the handle member. As illustrated, the handle member 13 comprises a first contacting edge 131 defined by a longitudinal end face, and a second contacting edge 132 defined by a narrow side face (the right side face in FIGS. 2 and 3), with the first contacting edge 131 and the second contacting edge 132 selectively engaging with the stopping portion 121. A distance of the first contacting edge 131 from the pivot 14 (e.g., its axis) is smaller than a distance of the second contacting edge 132 from the pivot 14. Moreover, the handle member 13 includes a curved transition portion 133 between the first contacting edge 131 and the second contacting edge 132. For the plate-like elongated handle member 13 in the illustrated embodiment, the definitions of the longitudinal end face and the narrow side face (not the plate surface having a larger area) are clear to the person skilled in the act. Although in the illustrated embodiment the contacting edges are defined by the end face and side face of the elongated handle member, it is conceivable of other configurations, as long as the contacting edges can provide different distances from the pivot axis. Besides, it should be appreciated that in other embodiments the handle member can rotate by different angles such as more than or less than 90°. For example, provided on the end face or the side face of the handle member may be a bulge which defines the second contacting edge, such that as the handle member rotate by an angle of e.g., less than 90° to abut the bulge against the stopping portion, the clamping portions of the first and second members may be secured to either of the housing.

Figure 4A:
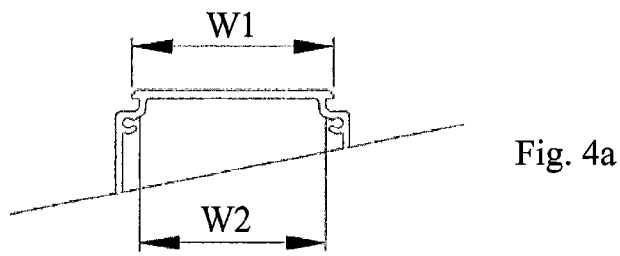
FIG. 4a-4e are the principle schematic views to show how the retaining device according to an embodiment of the invention to be secured to the rail member.
Figure 4B:
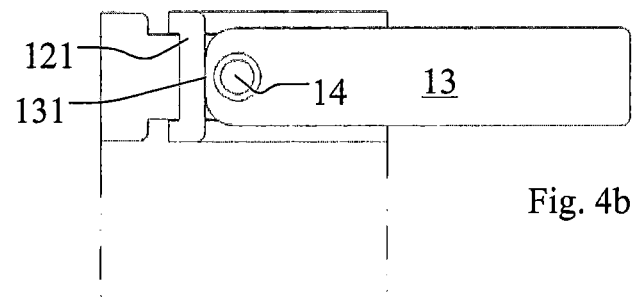
Figure 4C:
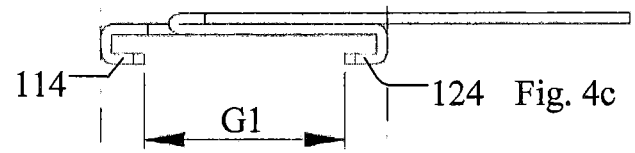
Figure 4D:
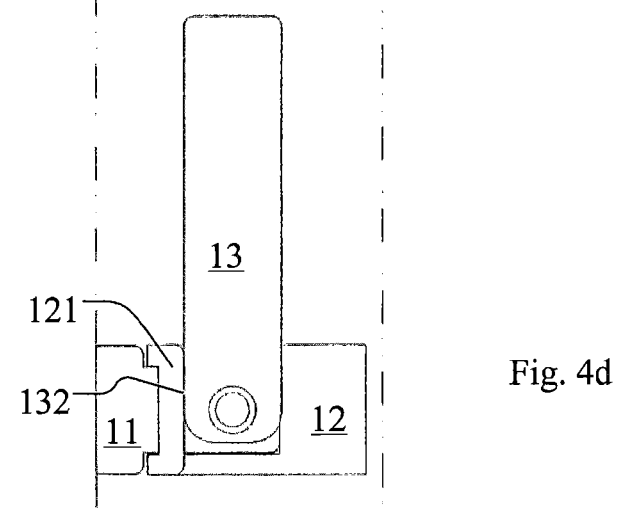
Figure 4E:
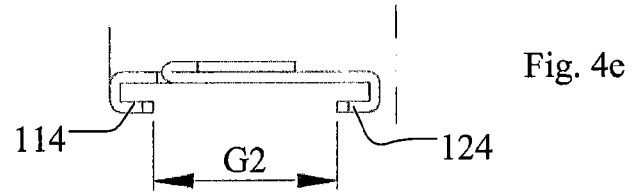

Referring to FIGS. 4a-4e along with FIGS. 5 and 6, how the retaining device 1 according to the embodiment to be secured to the housing 2 (sliding rack member) is illustrated. As illustrated in FIG. 4a and FIG. 5, the housing 2 comprises the first groove 21 and the second groove 22 extending longitudinally at both sides respectively. The first and second grooves each have a side facing the retaining device 1 (i.e. the back side of the housing) and defined by a flange 27, such that the flange 27 has a first width W1 (for example measured in a transverse, horizontal direction substantially perpendicular to the longitudinal direction of the housing 2), and a second, narrower width W2 defined between the bottoms of the first and second grooves.

Accordingly, the retaining device 1 is configured such that due to the different distances of the first and second contacting edges 131, 132 from the pivot 14 (axis), when the first contacting edge 131 contacts the stopping portion 121, a first, wider distance G1 is defined between the two hook portions 114 and 124; and when the second contacting edge 132 which is farther from the pivot 14 contacts with the stopping portion 121, the handle member 13 pushes the second member 12 towards the first member 11 by pushing the stopping portion 121, and thus a second, narrower distance G2 is defined between the two hook portions 114 and 124.

By means of the width differences and the variation of the distances, the retaining device 1 according to the invention can be secured to the housing in various ways. In one embodiment, as illustrated in FIGS. 5 and 6, the first distance G1 can be greater than the first width W1, while the second distance G2 can be smaller than the second width W2, such that when the first contacting edge 131 contacts the stopping portion 121, the retaining device 1 is allowable to be detached from the housing 2, and when the second contacting edge 132 contacts the stopping portion 121, the first and second hook portions 114, 124 are pressed into the bottoms of the first and second grooves 21,22 so as to be secured to the housing 2.

Figure 7A:
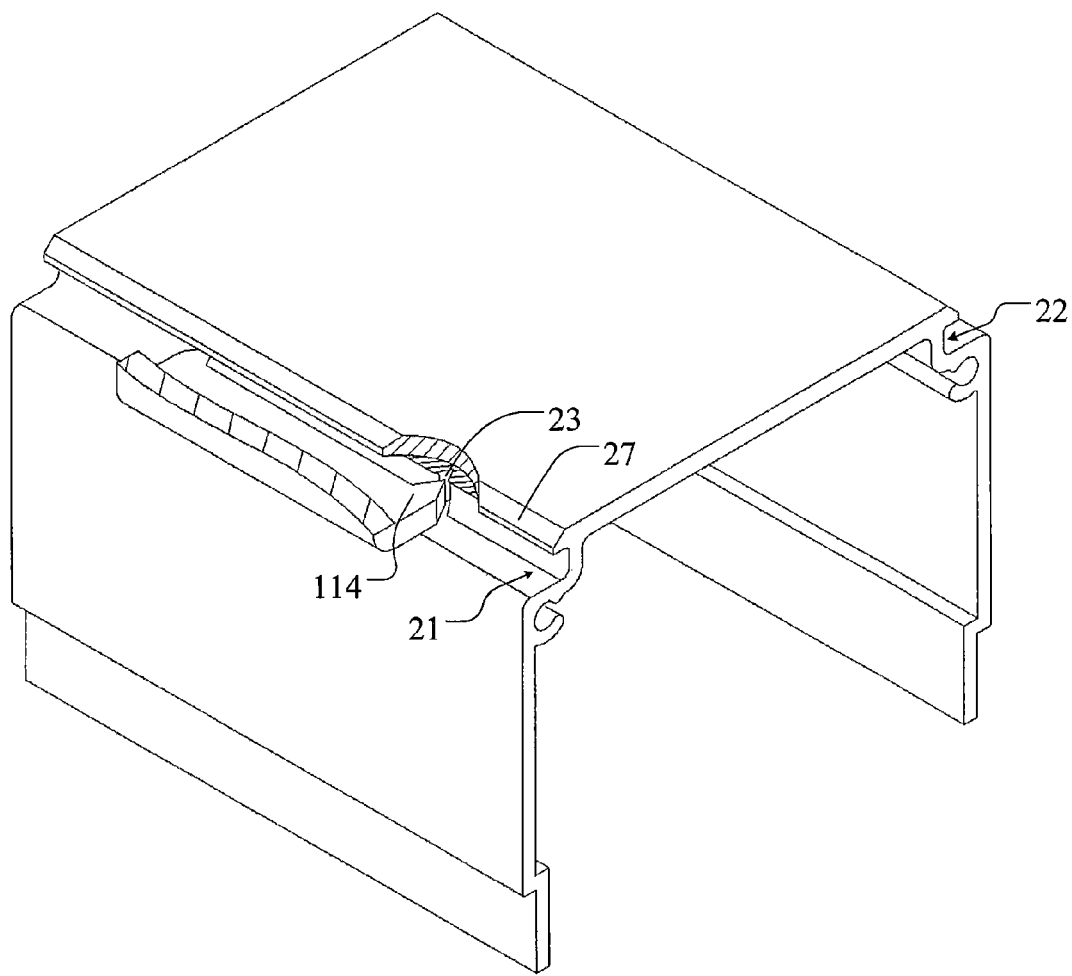
Figure 7B:
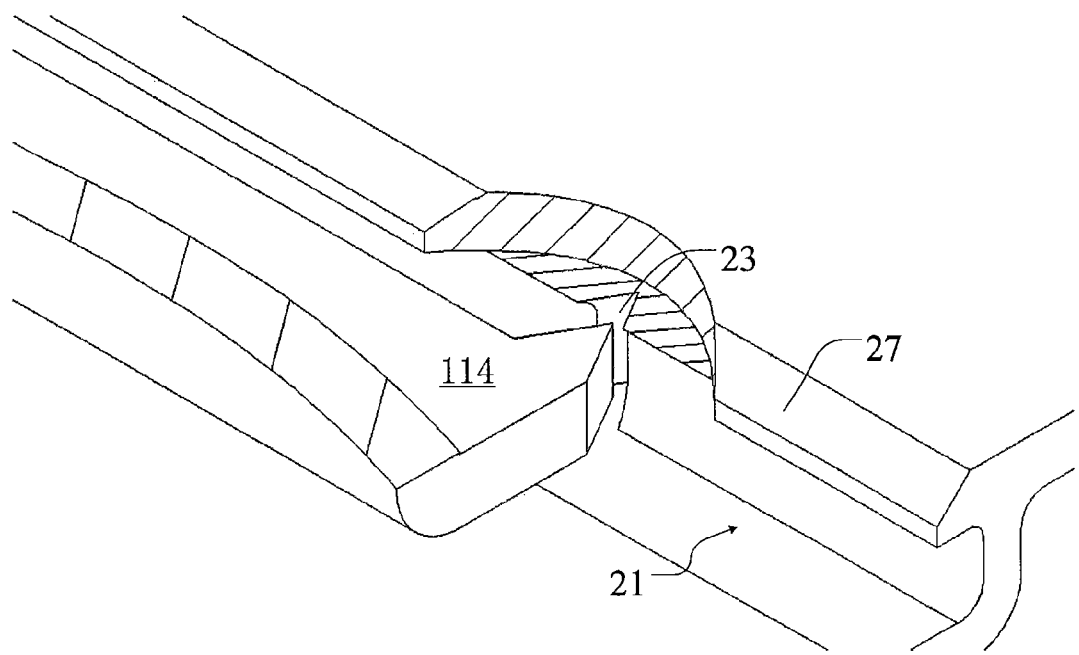
Figure 7C:
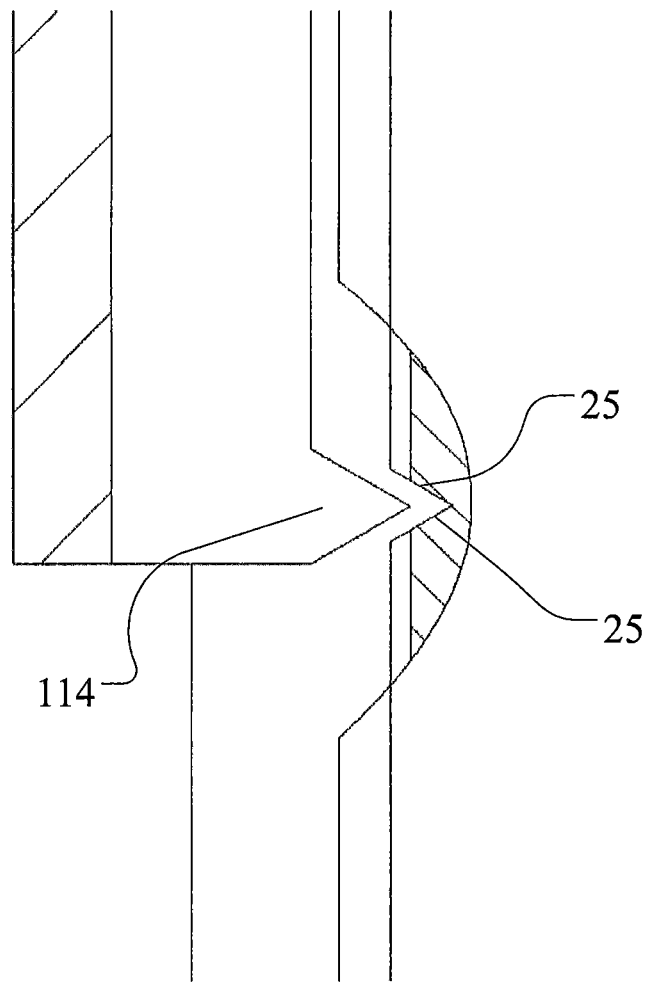

In another embodiment, as shown in FIGS. 7a and 7b, the first groove and the second groove each define an indentation or cut 23 (only a first indentation 23 is shown, while no second indentation is shown, but it should be appreciated that a second indentation may be similarly provided in the second groove). The indentations or cuts each have edge portions 25 at longitudinal ends adapt to hold at least a portion of the first and second hook portions 114 and 124 when the second contacting edge 132 contacts the stopping portion 121. In this embodiment, the second distance G2 is again smaller than the second width W2, but now the hook portions each have pointed tips engaging into the indentations of the grooves, such that the retaining device 1 can be secured to the housing 2, with or without press fit of the hook portions with the housing material. In FIG. 7c, for better illustration, the first hook 114 does not contact the edge portion 25, however it should be appreciated that in the normal installation condition, the first hook 114 (or similarly the second hook 124) will abut against the lower edge portion 25 due to the weight of the retaining device 1, but when the retaining device 1 abuts against the sliding rack for stopping the relative movement of the housing 2, the first hook 114 will abut against the upper edge portion 25 due to the sliding rack, thereby stopping the movement of the housing. Preferably, the shape of the indentation 23 in the longitudinal direction conforms to that of the hook portion. In the illustrated embodiment, the indentation 23 may be the dimple formed from the previous fixation of the retaining device into the housing, however it should be appreciated that an indentation having a limiting edge portion may be prefabricated in either side of the housing 2 (especially in the bottoms of the grooves) by means of any suitable known means.

Moreover, a PDU assembly with the retaining device 1 can be provided with the width difference and the variation of the distances. In the assembly, the second distance G2 is still smaller than the second width W2, while the first distance G1 is configured to be smaller than the first width W1 but greater than the second width W2, such that the first hook 114 and the second hook 124 are loosely mounted into the first and second grooves in such way that they are undetachable from the housing 2 when the first contacting edge 131 abuts against the stopping portion 121.

Although in the preferred embodiment the retaining device 1 is positioned into the housing 2 with the first and second grooves which can prevent the retaining device from detaching from the backside of the housing during installation, it should be appreciated that in absence of any groove, the retaining device may be secured into both sides of the housing 2 by means of press fit and/or indentations and/or cuts when the second contacting edge 132 contacts the stopping portion 121, which still falls within the scope of the invention.

As illustrated in FIGS. 5 and 6, the retaining device 1 may comprise a buffering member 15 which provides buffering action during the relative movement between the rail member and the sliding rack 3. The buffering member 15 may be in form of a sheet shape, and attached to the first member 11 at the side away from the handle member 13 in the illustrated embodiment.

Although the preferred retaining device for the PDU is described above, the retaining device according to the invention may be used to stop the relative movement between other rail member and the sliding rack fixed to the rail member, which still falls within the scope of the invention.

The exemplary embodiments of the invention are described above for the illustrative purpose, but not for limiting the scope of the invention. It should be appreciated by the person skilled in the art that any equivalent variations, modifications and combinations made without departing from the principles and spirits of the invention fall within the scope of the invention.

The invention claimed is:

1. A retaining device for a housing, the retaining device comprising:
   a first member having a first hook portion configured to engage a first groove on a first side of the housing;
   a second member having a second hook portion configured to engage a second groove on a second side of the housing; and
   a handle member pivotally mounted onto the first member via a pivot attached to the first member,
   wherein the second member comprises a stopping portion, and the handle member comprises a first contacting edge and a second contacting edge which abut the stopping portion by pivotal movement of the handle member to first and second positions, respectively, and
   wherein a distance between the second contacting edge and the pivot is greater than a distance between the first contacting edge and the pivot, such that a distance between the first and second hook portions decreases when the handle member is moved from the first position to the second position so as to clamp the retaining device to the housing.

2. The retaining device according to claim 1, wherein the first groove and the second groove extend longitudinally along the first side and the second side, respectively, and the first hook portion and the second hook portion are configured to press fit into the housing at bottoms of the first groove and the second groove, respectively, when the second contacting edge contacts the stopping portion.

3. The retaining device according to claim 1, wherein the housing comprises a first indentation and a second indentation in the first groove and the second groove, respectively, the first indentation and the second indentation each having a limiting edge portion that inhibits movement of the retaining device relative to the housing, and the first hook portion and the second hook portion are configured to be positioned in the first indentation and the second indentation, respectively, when the second contacting edge abuts against the stopping portion, and to be released from the first indentation and the second indentation, respectively, when the first contacting edge abuts against the stopping portion.

4. The retaining device according to claim 1, wherein the first member defines a wider portion and a narrower portion, and the second member has a cut-out which opens laterally, the narrower portion being slidably received in the cut-out.

5. The retaining device according to claim 1, wherein the handle member is a plate-like elongated member, the first contacting edge being defined by a longitudinal end face of the handle member and the second contacting edge being defined by a narrow side face of the handle member, and provided between the first contacting edge and the second contacting edge is a curved transition section.

6. The retaining device according to claim 1, further comprising a buffering member that provides buffering during movement of the housing.

7. The retaining device according to claim 6, wherein the buffering member has a sheet shape, and is attached to the first member at a side of the first member facing away from the handle member.

8. The retaining device according to claim 1, wherein each of the first member, the second member and the handle member are integrated in a sheet metal part.

9. A power distribution unit assembly, comprising:
a power distribution unit housing including a first groove and a second groove longitudinally extending along first and second sides of the housing, respectively, and
a retaining device comprising:
a first member having a first hook portion configured to engage the first groove;
a second member having a second hook portion configured to engage the second groove; and
a handle member pivotally mounted to the first member via a pivot,
wherein the second member comprises a stopping portion, and the handle member comprises a first contacting edge and a second contacting edge which abut the stopping portion by pivotal movement of the handle member to first and second positions, respectively, and
wherein a distance between the second contacting edge and the pivot is greater than a distance between the first contacting edge and the pivot, such that a distance between the first and second hook portions decreases when the handle member is moved from the first position to the second position so as to engage the first and second hook portions with the first and second grooves, respectively, and thereby clamp the retaining device to the housing.

10. The power distribution unit assembly according to claim 9, wherein the first hook portion and the second hook portion are configured to press fit into the housing at bottoms of the first groove and the second groove, respectively, when the second contacting edge abuts the stopping portion.

11. The power distribution unit assembly according to claim 9, wherein the housing in the first groove and the second groove has a first indentation and a second indentation therein, respectively, the first indentation and the second indentation each having a limiting edge portion that inhibits movement of the retaining device relative to the housing, the first hook portion and the second hook portion being configured to engage into the first indentation and the second indentation, respectively, when the second contacting edge abuts against the stopping portion.

* * * * *